United States Patent [19]

Perugini et al.

[11] Patent Number: 5,396,402
[45] Date of Patent: Mar. 7, 1995

[54] APPLIANCE FOR ATTACHING HEAT SINK TO PIN GRID ARRAY AND SOCKET

[75] Inventors: Michael N. Perugini, Monroe; David H. Romatzick, Jr., Milford, both of Conn.

[73] Assignee: Burndy Corporation, Norwalk, Conn.

[21] Appl. No.: 66,821

[22] Filed: May 24, 1993

[51] Int. Cl.6 ............................................. H05K 7/20
[52] U.S. Cl. .................................. 361/704; 257/718; 257/719; 361/710
[58] Field of Search ............................ 165/80.3, 185; 257/718–719, 726–727; 174/16.3; 361/383, 386–389

[56] References Cited

U.S. PATENT DOCUMENTS

| | | |
|---|---|---|
| D. 262,961 | 2/1982 | McCarthy . |
| D. 272,902 | 3/1984 | Johnson et al. . |
| D. 275,749 | 10/1984 | McCarthy . |
| D. 296,323 | 6/1988 | McCarthy . |
| D. 296,324 | 6/1988 | McCarthy . |
| D. 303,786 | 10/1989 | McCarthy . |
| D. 307,540 | 5/1990 | McCarthy . |
| D. 313,399 | 1/1991 | Earl et al. . |
| D. 317,907 | 7/1991 | McCarthy . |
| D. 322,594 | 12/1991 | McCarthy . |
| 4,345,267 | 8/1982 | Corman et al. . |
| 4,587,595 | 5/1986 | Staples . |
| 4,660,123 | 4/1987 | Hermann . |
| 4,712,159 | 12/1987 | Clemens . |
| 4,933,746 | 6/1990 | King . |
| 5,040,096 | 8/1991 | Churchill et al. . |
| 5,208,731 | 5/1993 | Blomquist ........................... 257/718 |

OTHER PUBLICATIONS

IBM Tech Disc. Bulletin, "Low Profile Heat Sink", vol. 28, No. 12, Jul. 1986, pp. 5172–5173.
IBM Technical Disclosure Bulletin, vol. 23, No. 12, May 1981, p. 5303.

Primary Examiner—Gregory D. Thompson
Attorney, Agent, or Firm—Hoffman, Wasson & Gitler

[57] ABSTRACT

A device for attaching a heat sink to a chip having an integrated circuit and a pin grid array socket. The device includes a leaf spring pre-assembled to two plastic clips, each of the plastic clips containing a portion which is adapted to extend below the socket, thereby releasably securing the heat sink to the chip and the socket.

3 Claims, 5 Drawing Sheets

APPLIANCE FOR ATTACHING HEAT SINK TO PIN GRID ARRAY AND SOCKET

BACKGROUND OF THE INVENTION

1. Field of the Invention

The present invention is directed to a clip for attaching a heat sink to a pin grid array integrated circuit and pin grid array socket.

2. Description of the Prior Art

By their very nature and construction, integrated circuits generate a significant amount of heat which must be removed from the area of operation. Typically, a heat sink containing a plurality of fins or disks is applied to the above structure which is attached to the integrated circuit. Since this heat sink includes a plurality of fins or disks, heat generated by the integrated circuit would be directed away from the integrated circuit to ensure that this circuit does not become overheated.

Since this problem of over heating has been well documented for many years, a number of different alternatives have been proposed to securely attach the heat sink to the integrated circuit. For example, the IBM Technical Disclosure described in Volume 23, No. 12, at Page 5303 describes a heat sink which can be slipped over an integrated circuit module utilizing a U-shaped spring clip having one or more slots, as well as feet to engage the underside of the module. Furthermore, U.S. Pat. No. 4,660,123, issued to Hermann, illustrates a spring clip bent into an H-shape for attaching a cooling member to an integrated module and a plug base. The clip includes T-shaped projections which engage into correspondingly arranged, rectangular recesses at the side of the plug base. An opening is disposed in the middle of the spring clip allowing the core diameter of a cooling member to fit therein. Furthermore, U.S. Pat. No. 4,587,595, issued to Staples, shows a heat sink which is attached to an integrated circuit by a plastic clip-on member. The plastic clip-on member has a pair of tabs located at the corner of the integrated circuit holder. Finally, U.S. Pat. No. 4,345,267, issued to Corman et al., describes a device for connecting a heat sink to an active device substrate. As illustrated in FIGS. 6 and 7, a U-shaped spring member having legs joined by a bight are employed for this purpose.

Although many prior art devices have addressed the problem of adequately securing a heat sink to an active device substrate, such as an integrated circuit, no prior art reference teaches the use of the particular clip-on device which is employed by the present invention.

SUMMARY OF THE INVENTION

The problems of the prior art are addressed by the present invention which provides a secure, simple means for attaching a heat sink to a pin grid array chip and pin grid array socket without damage to the integrated circuit or printing. This is accomplished by employing, in one embodiment, two plastic clips which are pre-assembled to a leaf spring that snap fits over the heat sink and under the pin grid array socket to attach the heat sink to the integrated circuit and the socket. A second embodiment employs two or more U-type leaf springs which are attached to one another by a webbing material. Hooks are provided on the side surface of the pin grid array socket for the purpose of securing the ends of the leaf springs thereto.

A third embodiment employs at least two clip-on holders, each provided with a coil spring which is adapted to surround one of the fins of the heat sink. The clip itself is attached to the undersurface of the pin grid array socket in a manner similar to the first embodiment.

BRIEF DESCRIPTION OF THE DRAWING

These and other objects of the present invention will be described with respect to the following drawings in which.

DETAILED DESCRIPTION OF THE PREFERRED EMBODIMENTS

Figure 1:
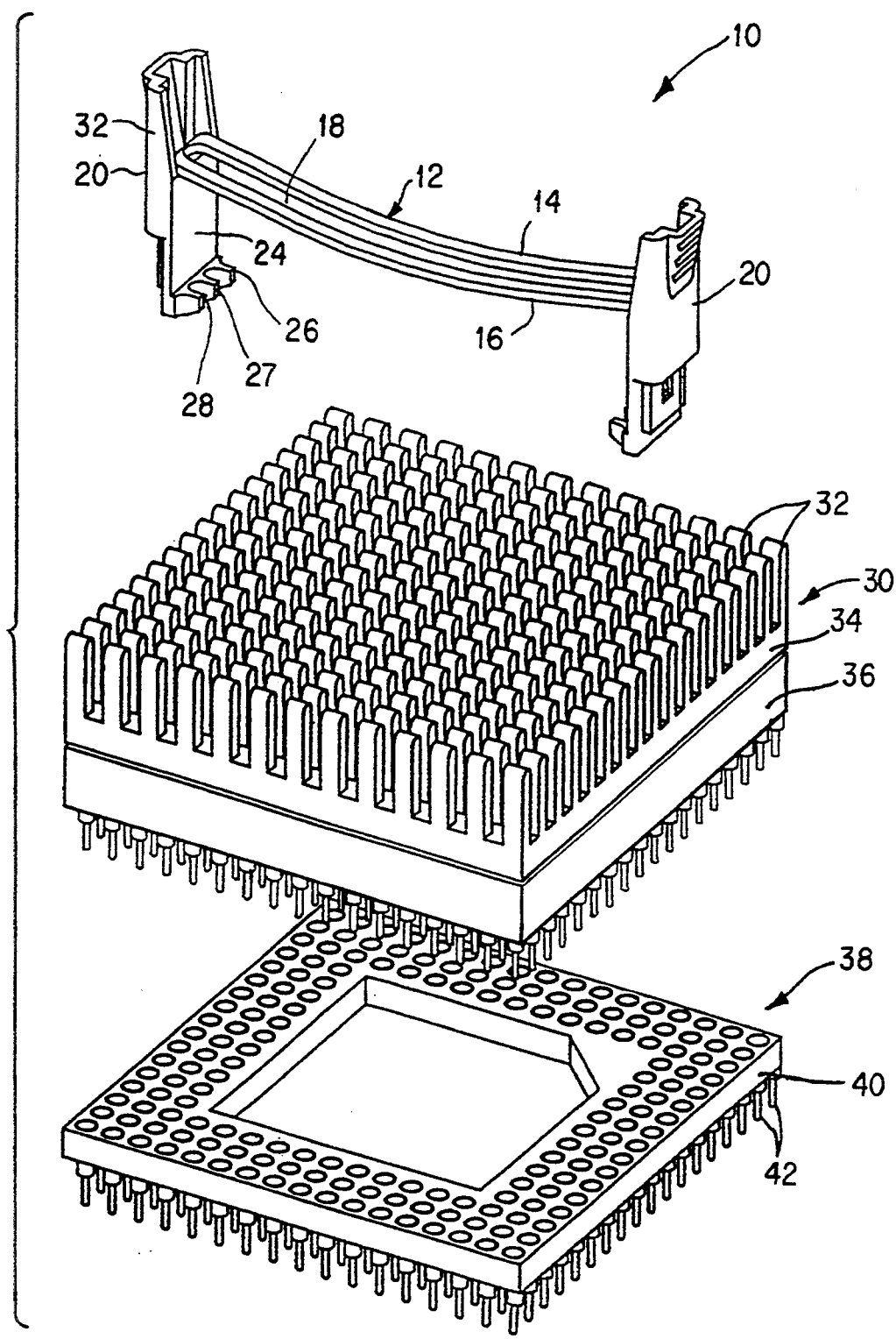
FIG. 1 is an exploded view of a first embodiment of the present invention.

FIG. 1 illustrates an exploded view of the clip of the present invention. This clip 10 includes a metallic or plastic leaf spring 12 provided with one longitudinal spring surface 14 and a second parallel, longitudinal spring surface 16 separated to fit between fins of heat sink 32. The leaf springs 12 can be formed from a single piece of material with slot 18 provided between the longitudinal surfaces 14 and 16. Alternatively, the leaf springs 12 can be formed from two separate pieces of spring wire. The leaf spring is snap fitted into two plastic clips 20, each clip having a top portion 22 and a bottom portion 24 and an intermediate portion therebetween to receive the end of the leaf spring 12. Feet portions 26 extend from the bottom of portion 24. Each foot portion is provided with a plurality of extended portions 27 separated from adjacent portions by hollowed out portions 28.

The clip 10 is adapted to fit over a pin grid array heat sink 30 containing a plurality of fins 32, a base portion 34 on which rests an integrated circuit 36 or similar device. The heat sink 30 is configured to lie above a pin grid array socket 38 having a base structure 40 with a plurality of connecting pins 42 extending therefrom. Although the exact configuration of the sink 30 and a socket 38 are not important, it is important that the perimeters of these devices be substantially equal to one another.

Figure 2:
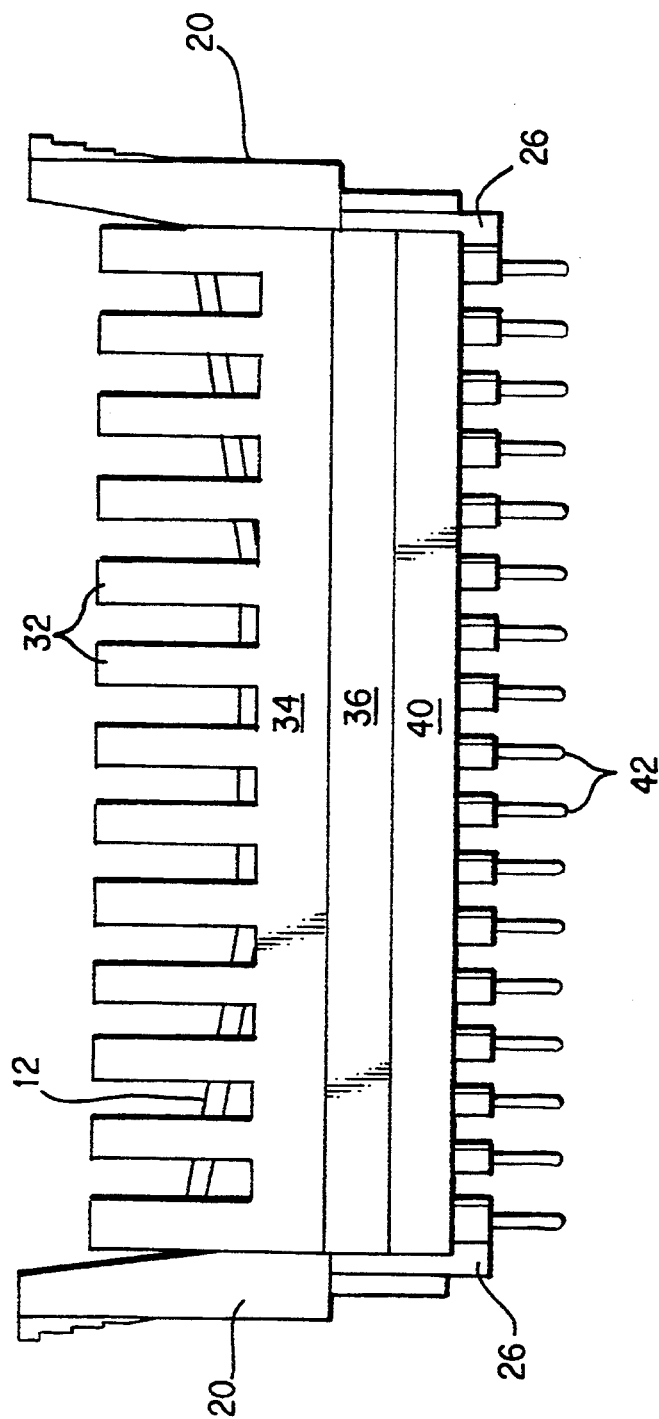
FIG. 2 is a side view of the first embodiment of the present invention.

As shown in FIG. 2, when the clip-on device 10 is assembled, a line of fins 32 is adapted to fit through the slot 18 and the feet 26 of each of the clips 20 would be forced underneath the base 40 of the pin grid array socket 38. The hollowed out portions 27 are designed to enclose the top portions of at least one of the pins 42. This particular configuration would allow the heat sink to be snugly, but removably provided atop the pin grid array chip 36 as well as the pin grid array socket 38.

Figure 3:
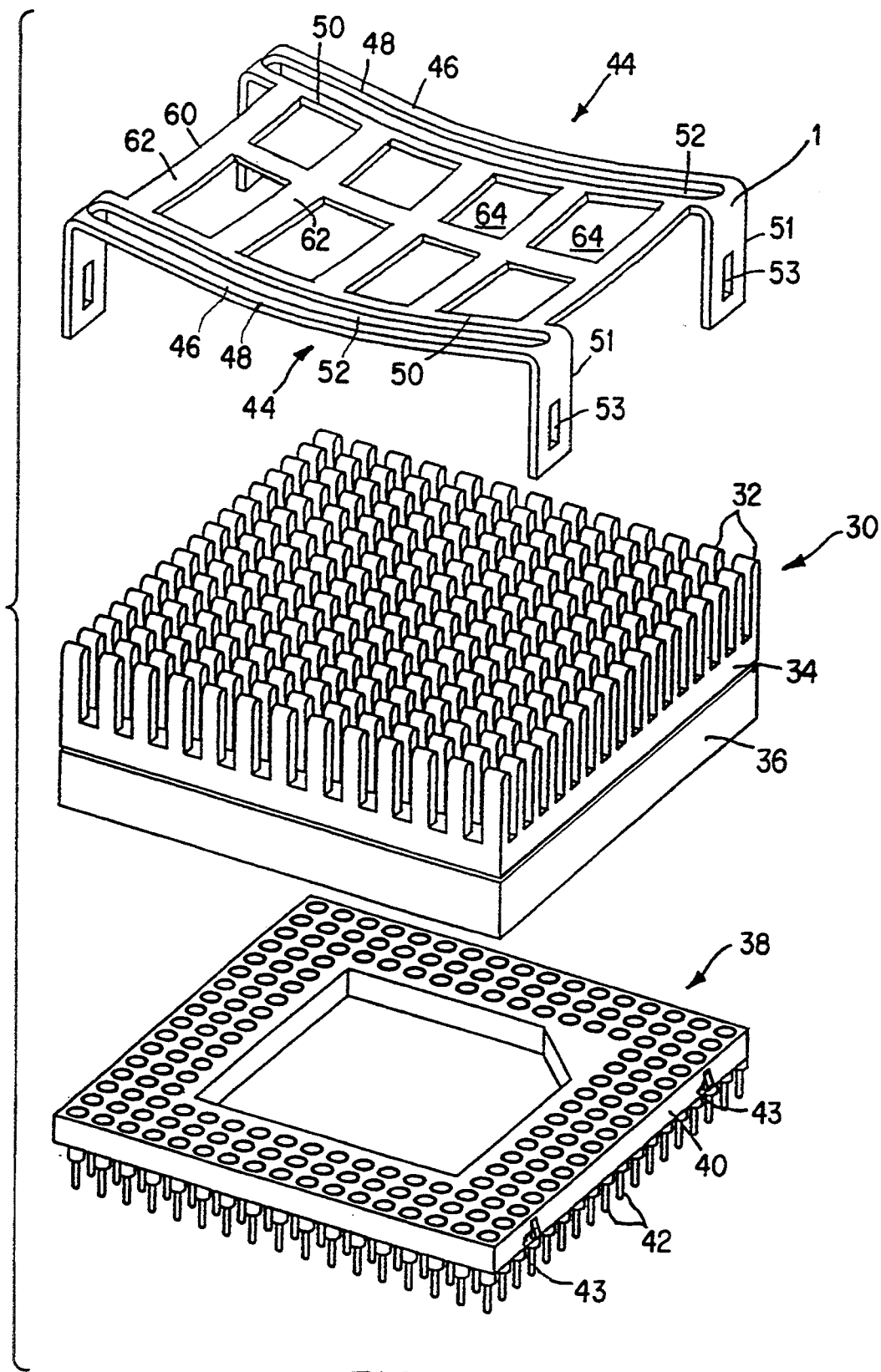
FIG. 3 is an exploded view of a second embodiment of the present invention.
Figure 4:
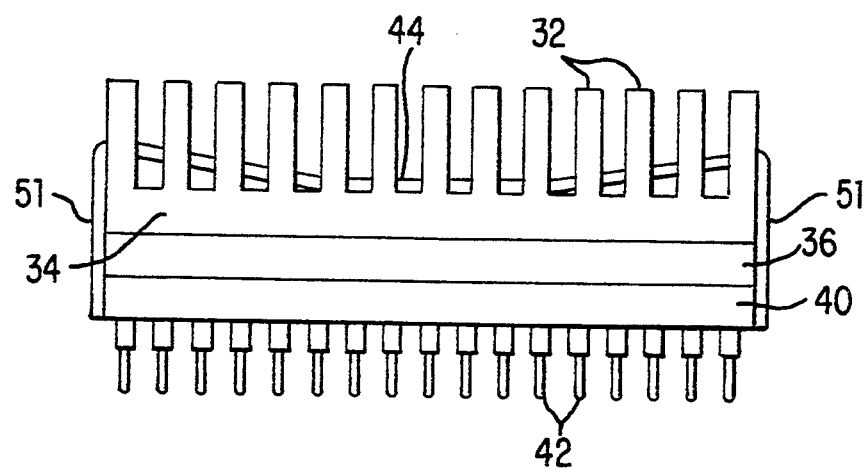
FIG. 4 is a side view of the second embodiment of the present invention.
Figure 5:
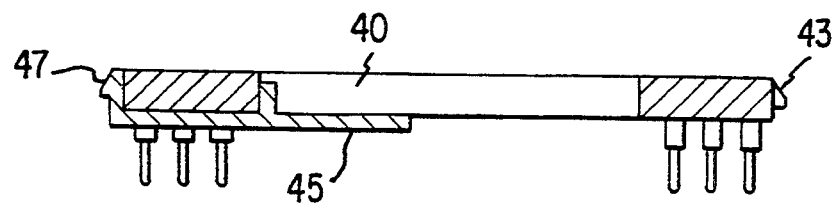
FIG. 5 is a side view of the pin grid array socket of the second embodiment of the present invention showing two manners in which a hook can be applied to the socket.

FIGS. 3, 4 and 5 illustrate a second embodiment of the present invention 44 which illustrates the use of one or more U-shaped leaf springs 46, each leaf spring provided with longitudinal surfaces 48 and 50 separated by a longitudinal slot 52. Additionally, each of the leaf springs is provided with legs 51 having an aperture 53 provided in each leg. Each of the leaf springs 46 is attached to one another by a webbing material 60 provided with a plurality of transverse slats 62 creating a plurality of apertures 64 therebetween. This web can be constructed from a number of flexible plastic or metallic materials. Similar to the embodiment illustrated in FIGS. 1 and 2, this embodiment would allow a pin grid array heat sink 30 having a plurality of fins 32 extending from the top surface thereof to be firmly secured to a chip 36 provided with an integrated circuit thereon. Additionally, a pin grid array socket 38 similar to the socket described in FIGS. 1 and 2 is also utilized. However, at least two of the side surfaces of the socket 40 are provided with detents 43 which cooperate with the apertures 53 of the spring clip 44 to secure the spring clip to the heat sink, integrated circuit and socket. As can be appreciated, one or more of the fins 32 would extend through each of the open areas 64 of the clip 44. As can be appreciated by FIGS. 3, 4 and 5, a plurality of fins 32 would fit in the slots 52 as well as through the apertures 64, when the clip is removably applied to the heat sink and the socket.

As illustrated in FIG. 5, the detents 43 could be included on the socket 40 during the manufacture process. Alternatively, a special piece 44 having a detent 47 provided therein can be specially fit onto the bottom and side surfaces of this socket.

Figure 6:
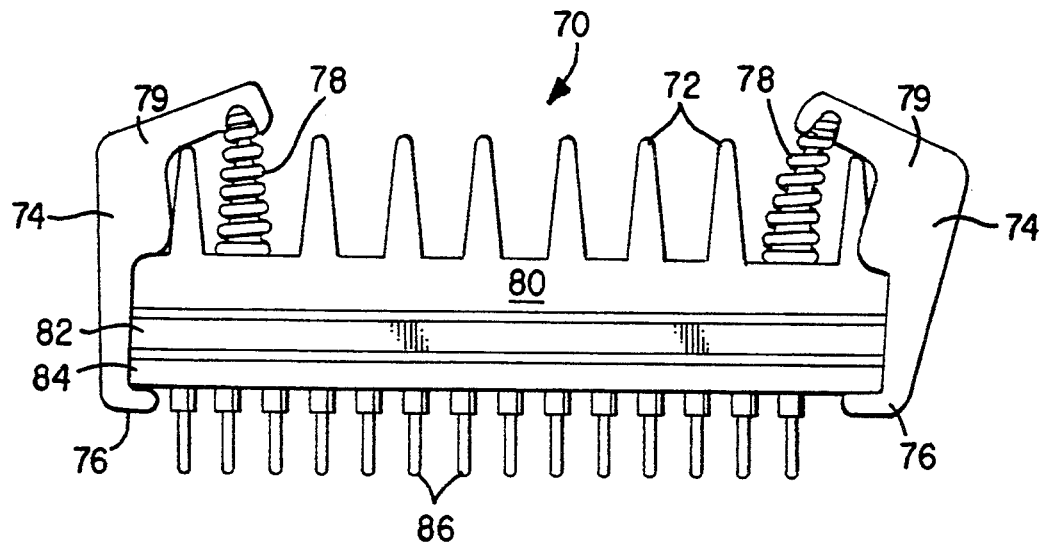
FIG. 6 is a side view of a third embodiment of the present invention.
Figure 8:
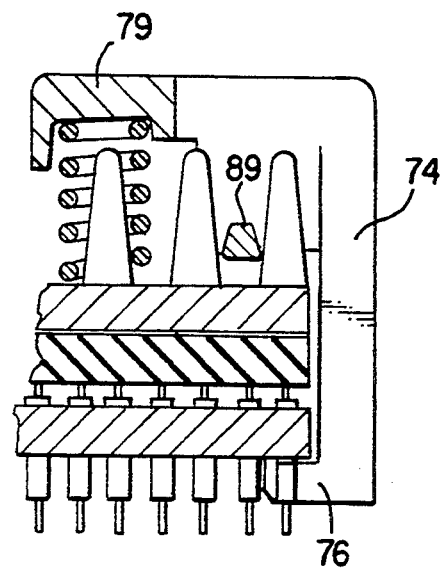
FIG. 8 is a side view of the third embodiment of the present invention showing the clip in place.
Figure 7:
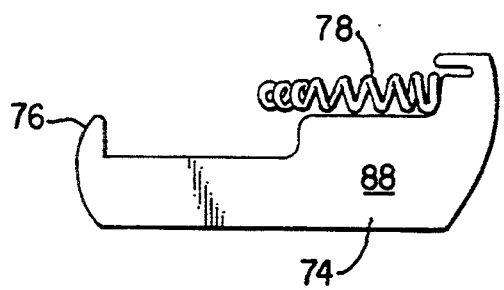
FIG. 7 is a side view of the clip used in the third embodiment of the present invention.

FIGS. 6 and 7 illustrate a third embodiment of the present invention in which separate clips 74 are applied to the sides of the heat sink 80 provided atop an integrated circuit 82 and a pin grid array socket 84 having a plurality of pins 86 extending from the bottom thereof. A coil spring 78 is affixed to the top portion 79 of the clip 74. Each clip is provided with foot section 76 which is adapted to fit under the pin grid array socket 84 securing the clip thereto. Additionally, each of the coil spring 78 is adapted to fit over one of the fins 72 of the heat sink 70. Clip 74 provided with a pivot 89 that fits between fins 72 of heat sink 70. Pivot 89 causes spring 78 to apply a rotating force to clip 74 about heat sink fins 72. Said rotating force maintains inward pressure between feet 76 and pin grid array socket 84 to prevent inadvertent removal of clip 74 from assembly. Therefore, when the clip 74 is applied to the heat sink, integrated circuit and socket combination, a tension is provided in the coil spring 78 which, in combination with the feet 76 would hold all of the elements in place. Although each of the clips 74 should be constructed from a plastic material, the exact material which is utilized is not of crucial importance. FIG. 8 is an embodiment showing the clip 74 in place.

It is to be understood that the forms of the invention as shown and described herein are but preferred embodiments thereof and that various changes and modifications can be made therein without departing from the spirit or scope of the invention.

What is claimed is:

1. An appliance for attaching a heat sink having a plurality of fins extending therefrom to an integrated circuit chip and a socket having a plurality of pins extending therefrom comprising:

a leaf spring having two parallel longitudinally extending elements creating one longitudinal slot therebetween, said longitudinal extending for the entire length of said leaf spring; and two clip elements, each of said clip elements attached to opposite ends of said longitudinally extending elements, each of said clip elements provided with a top portion and a bottom portion, said longitudinally extending elements of said leaf spring attached to each of said clip elements to form an H-shaped securing appliance, the bottom portion of each of said clip elements provided with feet extending transversely therefrom;

wherein when said appliance is applied to said heat sink, said integrated circuit and said socket, a plurality of said fins would extend through said slot and each of said feet of said clip elements would extend under said socket to secure said heat sink, said integrated circuit and said socket together.

2. The appliance in accordance with claim 1, wherein each of said feet are provided with a plurality of hollowed out portions, each of said hollowed out portion adapted to enclose a portion of at least one of the pins extending from the socket.

3. An electronic package comprising:

a planar heat sink provided with a plurality of fins extending therefrom;

a planar integrated pin grid array chip having an integrated circuit thereon, the perimeter of said chip equal to the perimeter of said heat sink;

a planar socket having a perimeter equal to the perimeters of said heat sink and said chip;

a device for securing said heat sink above said chip which in turn is provided above said socket, said device comprising a spring provided with two parallel spring surfaces thereby creating one longitudinal slot therebetween, said device further including two clip elements, each clip attached to opposite ends of said spring, each clip provided with a top section and a bottom section and a means intermediate said top section and bottom section for affixing said spring thereto, each of said clips further provided with feet extending transversely to said bottom section;

wherein when said appliance is applied to said heat sink, said integrated circuit and said socket, a plurality of said fins would extend through said slot and each of said feet of said clip elements would extend under said socket to removably secure said heat sink, said integrated circuit and said socket together.

* * * * *